US011573249B2

(12) United States Patent
Scott et al.

(10) Patent No.: US 11,573,249 B2
(45) Date of Patent: Feb. 7, 2023

(54) APPARATUS FOR PROVIDING A TEST SIGNAL FROM A DEVICE UNDER TEST (DUT) TO A MEASUREMENT INSTRUMENT

(71) Applicant: Keysight Technologies, Inc., Santa Rosa, CA (US)

(72) Inventors: Ryan Scott, Woodland, CA (US); Bogdan Szafraniec, Sunnyvale, CA (US); Mike T. Mctigue, Colorado Springs, CO (US); Howard Lankford, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 364 days.

(21) Appl. No.: 16/724,470

(22) Filed: Dec. 23, 2019

(65) Prior Publication Data

US 2021/0190830 A1    Jun. 24, 2021

(51) Int. Cl.
*G01R 31/00* (2006.01)
*G01R 31/308* (2006.01)
*G01R 1/04* (2006.01)
*G01R 1/067* (2006.01)
*G01R 1/073* (2006.01)
*G01R 13/02* (2006.01)
*G02F 1/21* (2006.01)

(52) U.S. Cl.
CPC ..... *G01R 13/0281* (2013.01); *G01R 1/06777* (2013.01); *G02F 1/21* (2013.01); *G02F 1/212* (2021.01)

(58) Field of Classification Search
CPC ...... G01R 31/00; G01R 31/02; G01R 31/308; G01R 1/04; G01R 1/067; G01R 1/073
See application file for complete search history.

(56) References Cited

U.S. PATENT DOCUMENTS

| 6,603,891 B2 | 8/2003 | Schumann |
| 10,225,022 B2* | 3/2019 | Booman ............ G01R 29/0885 |
| 10,234,501 B2 | 3/2019 | Mende et al. |
| 2014/0015541 A1 | 1/2014 | Sakai et al. |
| 2018/0328964 A1* | 11/2018 | Mende ................. G01R 13/347 |

OTHER PUBLICATIONS

Yejun Fu et al., "Mach-Zehnder A Review of Bias Control Techniques," IEEE Microwave Magazine, Nov./Dec. 2013, pp. 102-107.

(Continued)

*Primary Examiner* — Neel D Shah

(57) ABSTRACT

An apparatus for providing a test signal from a device under test (DUT) to a measurement instrument is disclosed. The apparatus includes a probe head configured to receive an electrical signal from the DUT. The probe head includes an electro-optic modulator. The apparatus also includes a control box, which includes an optical source. The optical source is configured to provide an input optical signal to the electro-optic modulator, which is configured to provide an output optical signal based on the electrical signal from the DUT. The control box also includes an optical bias control circuit. Only a bias control signal is provided to the electro-optic modulator.

22 Claims, 6 Drawing Sheets

(56) References Cited

OTHER PUBLICATIONS

Jean Paul Salvestrini et al., "Analysis and Control of the DC Drift in LiNbO3-Based Mach—Zehnder Modulators", Journal of Lightwave Technology, vol. 29, No. 10, May 15, 2011, pp. 1522-1534.
Ed L. Wooten et al., "A Review of Lithium Niobate Modulators for Fiber-Optic Communications Systems", IEEE Journal of Selected Topics in Quantum Electronics, vol. 6, No. 1, Jan./Feb. 2000, pp. 69-82.

* cited by examiner

APPARATUS FOR PROVIDING A TEST SIGNAL FROM A DEVICE UNDER TEST (DUT) TO A MEASUREMENT INSTRUMENT

BACKGROUND

High power electronics are ubiquitous in today's society, and have increasing applicability in a variety of endeavors such as automotive vehicles and trains. For example, these power electronics often include inverters, which convert a direct current (DC) signal to an alternating current (AC) signal, or which converts an AC signal into a DC signal.

Often, it is desired to measure both the AC and DC electrical signals from inverters or similar power electronics. However, direct measurement of high power electrical signals is not practical to known oscilloscopes or similar measurement instruments, which are connected electrically to ground.

What is needed, therefore, is an apparatus that overcomes at least the shortcomings of known measurements instruments discussed above.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
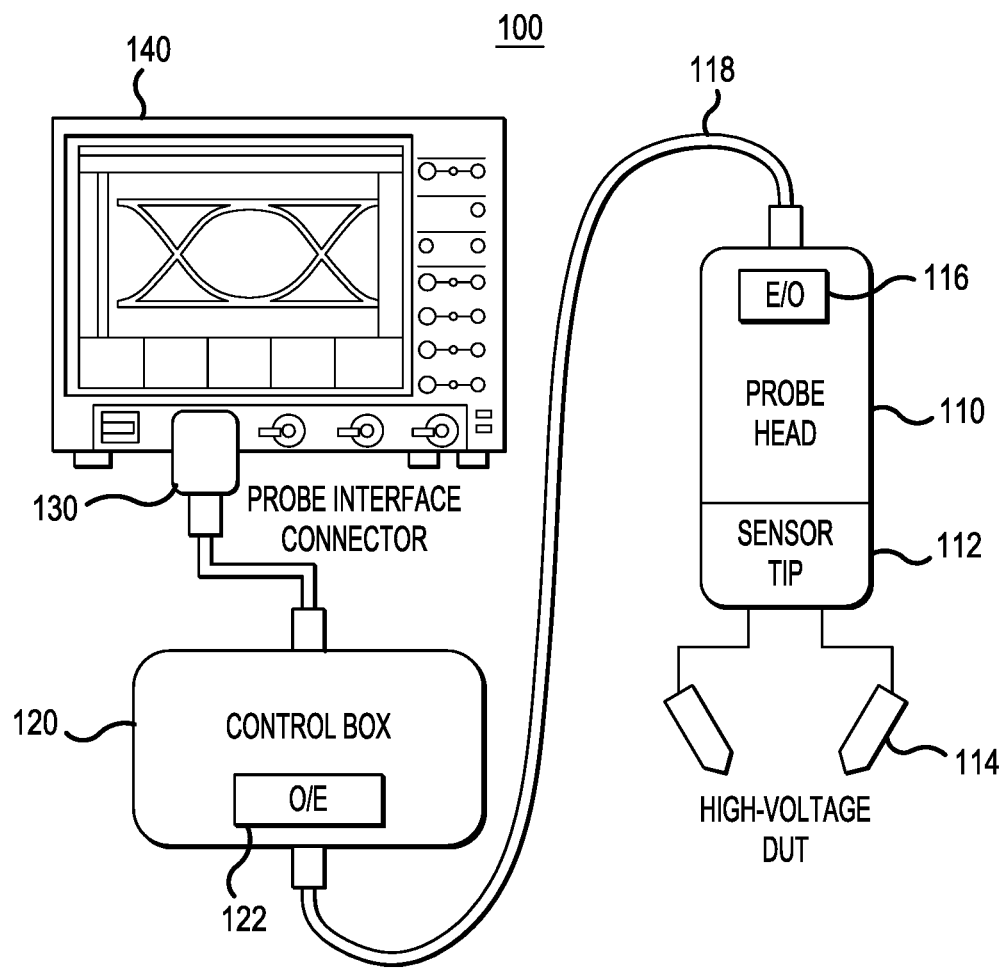
FIG. 1 is a simplified schematic block diagram of a system for measuring voltage levels of high power electrical signals from a DUT in accordance with a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element (e.g., an optical waveguide or electrical transmission line) is said to be connected to a second element (e.g., an optical to electrical (O/E) modulator, or an E/O modulator respectively), this encompasses cases where one or more intermediate elements or intervening devices may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various embodiments of an apparatus for providing a test signal from a device under test (DUT) to a measurement instrument are described herein.

In accordance with a representative embodiment, an apparatus for providing a test signal from a device under test (DUT) to a measurement instrument comprises: a probe head configured to receive an electrical signal from the DUT. The probe head comprises an electro-optic modulator. The apparatus also comprises a control box comprising: an optical source, which is configured to provide an input optical signal to the electro-optic modulator. The electro-optic modulator is configured to provide an output optical signal based on the electrical signal from the DUT. The apparatus also comprises an optical bias control circuit. A bias control signal is provided to the electro-optic modulator.

In accordance with another representative embodiment, an apparatus for providing a test signal from a device under test (DUT) to a measurement instrument comprises a probe head configured to receive an electrical signal from the DUT, and the probe head comprising an electro-optic modulator. The apparatus also comprises a control box comprising: an optical source, the optical source configured to provide an input optical signal to the electro-optic modulator, which is configured to provide an output optical signal based on the electrical signal from the DUT; and an optical bias control circuit. Only a bias control signal is provided to the electro-optic modulator.

Figure 2:
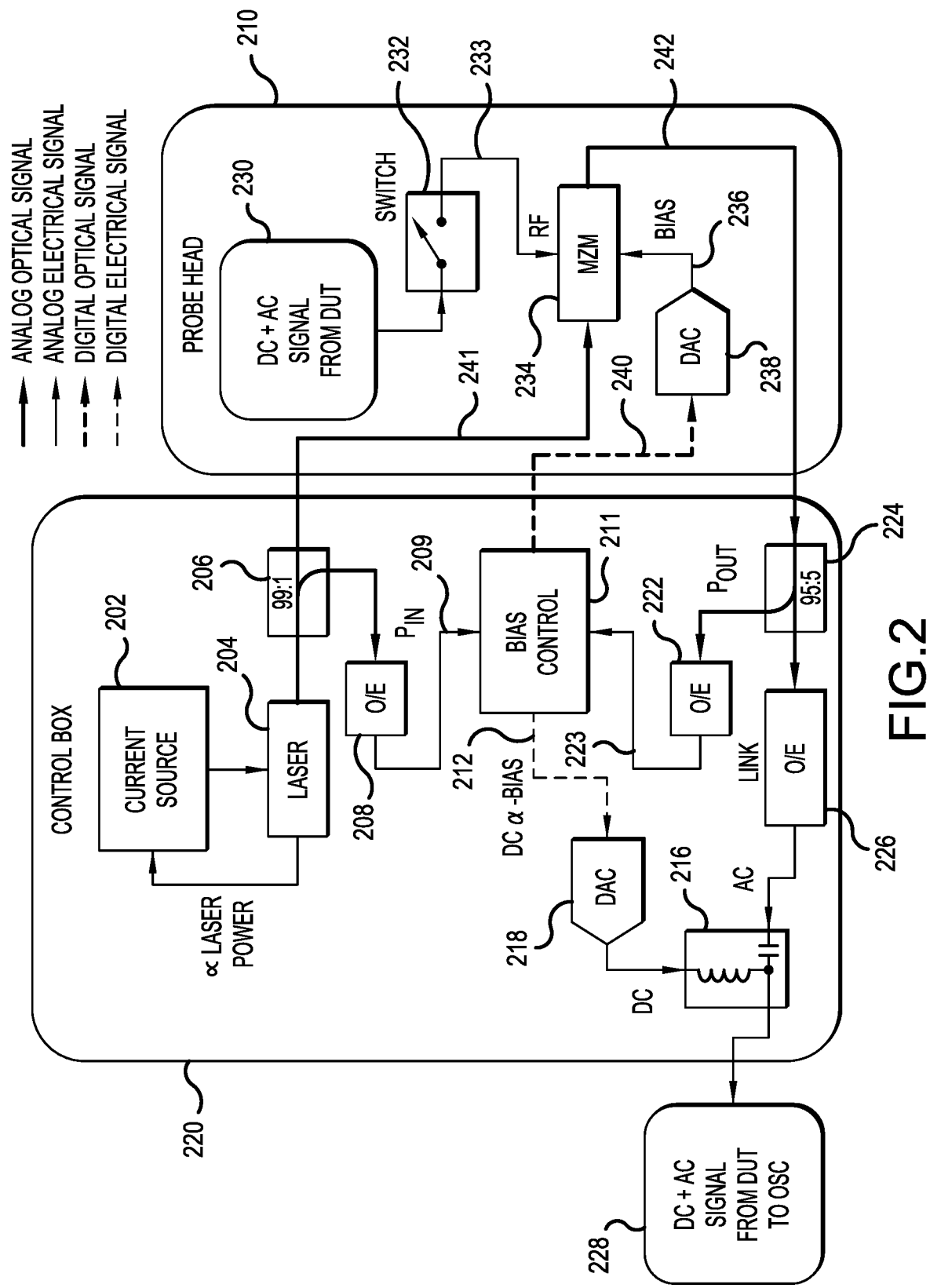
FIG. 2 is a simplified schematic block diagram of a probe head and a control box in accordance with a representative embodiment.

Notably, and as will be appreciated from a review of FIG. 2, in accordance with the present teachings, the probe head transmits only optical signals to, and receives optical signals from, the control box. As such, the probe head of the various representative embodiments is galvanically isolated from the control box and measurement instrument.

FIG. 1 is a simplified schematic block diagram of a system 100 for measuring voltage levels of high power electrical signals from a DUT in accordance with a representative embodiment.

The system 100 comprises a probe head 110, which comprises a sensor tip 112 and probes 114. The system 100 also comprises a control box 120, which is connected at one end to the probe head 110, and at another end to a probe interface connector 130. The probe interface connector 130 is connected to an oscilloscope 140, which measures the signals transferred from a device under test (DUT) (not shown in FIG. 1).

In accordance with a representative embodiment, the probe interface connector 130 and the oscilloscope 140 are known devices and are not described in significant detail herein. The probe interface connector 130 transmits the signals received from the control box 120, and provides power to the control box 120 during its operation.

In accordance with the present teachings, the signals received from the DUT are electrical signals, which may comprise an AC component and a DC component. As described more fully herein, the probe head 110 is adapted to receive electrical signals from the DUT via the probes 114. The electrical signals from the DUT are received at an electrical-to-optical (E/O) converter 116. The E/O converter 116 converts the electrical signals from the DUT to optical signals, which are transmitted to the control box 120 via an optical fiber 118. The optical signal transmitted by the probe head 110 to the control box 120 is converted to an electrical signal at an O/E converter 122 for measurement by the oscilloscope.

It is noted that the E/O converter 116 and the O/E converter 122 are disposed as shown in FIG. 1 symbolically for convenience. However, as described more fully herein these converters may be disposed solely in the control box 120, or in the probe head 110, or both. Moreover, the E/O converter 116 and the O/E converter 122 of FIG. 1 are symbolic of the electrical to optical and the optical to electrical conversions that occur in accordance with the present teachings. To this end, and as will become clearer as the present description continues, the probe head 110 galvanically isolates the oscilloscope 140 from the electrical signals received at the probes 114 and the sensor tips 112. The electrical signals received at the probes 114 may be comparatively high voltage electrical signals having both an AC and a DC component. Although the sensor tips 112 may incorporate voltage reducing networks, such as resistive voltage dividers, the need to preserve DC means that a galvanic connection still exists between the high voltage DUT and the probe head 110. As noted above, high voltage signals cannot be safely measured by oscilloscopes such as oscilloscope 140, which are connected electrically to ground. By the present teachings, the comparatively high voltage AC and DC signals are converted to optical signals prior to transmission to the control box 120. As described more fully herein, the control box 120 provides electrical signals with acceptably low voltage AC and DC components, which are representative of the high voltage AC and DC components from the DUT, to the oscilloscope 140. Finally, and as described more fully below, in accordance with various representative embodiments, the term DC includes both voltage signals with no time-varying component, or voltage signals with a time-varying component having a frequency that is less than a frequency response of an optical bias control circuit (not shown in FIG. 1), or a frequency of a crossover filter (shown in FIG. 5).

FIG. 2 is a simplified schematic block diagram of a probe head 210 and a control box 220 in accordance with a representative embodiment. The probe head 210 and the control box 220 are adapted to function in system 100 to allow measurement of both high voltage AC and high voltage DC signals from a DUT (not shown in FIG. 2). As such, various details of the description of system 100 are common to the description of the probe head 210 and the control box 220, but may not be repeated to avoid obscuring the descriptions of the representative embodiments of FIG. 2.

Referring to FIG. 2, the control box 220 comprises a current source 202, which provides an input to a laser 204. Notably, a portion of the output laser power is input to the current source 202 via a feedback loop so that the power of the signal output from the laser 204 remains substantially constant for reasons that will become clear as the present description continues.

The output from the laser 204 is provided to a first optical tap 206. The first optical tap 206 provides a significant portion of the signal output power from the laser to the probe head as described below. A small portion (illustratively approximately 1% to approximately 5%) of the power output from the laser 204 is provided to a first O/E converter 208, and is representative of the input power ($P_{in}$) to a Mach-Zehnder Modulator (MZM) 234 in the probe head 210. As will be appreciated as the present description continues, the MZM 234 receives input electrical signals from the DUT, and outputs optical signals to the control box. As such, the MZM 234 functions as an E/O converter, and thus electrically isolates the oscilloscope 140 from the comparatively high voltage AC and DC signals from the DUT.

The first O/E converter 208 illustratively comprises a photodetector (not shown in FIG. 2) connected to a trans-impedance amplifier (TIA) (not shown in FIG. 2), and may be incorporated partly or completely in the optical bias control circuit 211. The first O/E converter 208 provides an electrical signal 209, which is proportional to $P_{in}$ from the laser 204, as a first input to optical bias control circuit 211. Notably, if $P_{in}$ is substantially constant, the first optical tap 206 can be foregone, and a constant input can be provided to the optical bias control circuit 211.

The electrical signal 209 from the laser 204 provided as one input to the optical bias control circuit 211 aids in biasing the MZM 234. As will become clearer as the present description continues, a first output signal 212 from the optical bias control circuit 211 is provided to a DAC 218. The first output signal is a digital electrical signal and is proportional to the bias voltage applied to the MZM 234 of the probe head 210, but having opposite sign. After conversion into an analog signal, the first output signal 212 from the optical bias control circuit 211 is provided to a summing circuit 216. Notably, AC and DC signals from a third O/E converter 226 and the DAC 218 are added together by the summing circuit 216. The summing circuit 216 is not required to provide filtering. Rather, the inductor symbol simply of the summing circuit 216 denotes the DC path while the capacitor symbol the summing circuit 216 denotes the AC path. The output from the summing circuit 216 is provided to the oscilloscope (not shown in FIG. 2) via a suitable electrical connector 228.

The probe head 210 receives an input signal from the DUT via a connection 230, which may comprise the sensor tip 112 and probes 114 shown in FIG. 1. The input signal comprises an AC component, and a DC component, which, as noted above, includes both voltage signals with no time-varying component, or voltage signals with a time-varying component having a frequency that is less than a frequency response of optical bias control circuit 211, as described more fully below.

The output from the connection 230 is provided to a switch 232. As described more fully below in connection with FIGS. 3A-3B, the switch 232 is needed to disconnect the DUT signal from the input (RF) port of the MZM 234 to "zero" the inferred DC voltage. This ensures proper operation of the probe head 210 in the presence of the drift in the MZM 234. When the switch 232 is closed and the MZM 234 is stable and biased in quadrature, the second input 236 to MZM 234, the first output signal 212, and the signal from DAC 218 are all representative of the DUT signal from DC to the bandwidth of the optical bias control circuit 211. However, when the MZM bias drift due to external factors becomes significant, by the present teachings, the switch 232 is briefly opened so that optical bias control circuit 211 and the first output signal 212 is reset to "zero." The frequency of this resetting procedure depends on the characteristics of the MZM 234, environmental changes, and the accuracy requirement of the apparatus. In general, the signal provided to the second input 236 differs from the first output signal 212 by an offset proportional to the second input 236 when the switch 232 is open. The MZM 234 is always biased in quadrature as described below and illustrated in FIG. 3B.

With the switch conducting, the input signal from the DUT is provided as a first input 233 to the RF input of the MZM 234. As will be appreciated, first input 233 is an analog electrical signal. A second input 236 serves as the bias input to the MZM 234. The signal to second input 236 is an analog electrical signal after the conversion by a DAC 238 of a bias signal 240 from the optical bias control circuit 211. As shown in FIG. 2, the bias signal 240 from the optical bias control circuit 211 to the probe head 210 is a digital optical signal, thereby ensuring the electrical isolation of the oscilloscope 140 from the DUT.

In operation, an input optical signal 241 is provided to the MZM 234, and an output optical signal 242 is provided from the MZM 234. The output optical signal 242 is provided to the control box 220 and is input to the second optical tap 224. As described more fully below, the output optical signal 242 contains AC signals having frequencies greater than the frequency response of the optical bias control circuit 211 to the third O/E converter 226 of the control box 220. By contrast, the optical bias control circuit 211 is not responsive to time varying (AC) signals having frequencies greater than its frequency response. This is expected as the optical bias control circuit 211 cannot respond to frequencies that are beyond its bandwidth. Rather, the optical bias control circuit 211 responds to the frequencies that are within its bandwidth including DC. Hence, the optical bias control circuit 211 contains information about DC signals and signals frequencies within its bandwidth, while it removes this content from the output optical signal 242 by applying the bias signal to the second input 236 to the MZM 234. As such, only AC signals greater than the bandwidth of the optical bias control circuit 211 are provided at output optical signal 242 of the MZM 234, and consequently routed to the control box 220 and the summing circuit 216.

The DC signals and signals having frequencies within the bandwidth of the optical bias control circuit 211 are provided to the summing circuit 216 by means of the first output signal 212 and the DAC 218. At the summing circuit 216, the DC signal from the DAC 218 is added with the AC signal from the third O/E converter 226 receiving the output optical signal 242. The addition may be weighted to compensate for different gain or loss in the AC path leading to the output of the third O/E converter 226 and the DC path leading to the output from the DAC 218. The added AC and DC signals reconstruct the first input 233 (the RF input) to the MZM 234, but having suitably low voltages to be safely routed to the oscilloscope 140.

A small portion (illustratively approximately 1% to approximately 5%) of the output optical signal power from the MZM 234 is provided to a second O/E converter 222. Like the first O/E converter 208, the second O/E converter 222 illustratively comprises a photodetector (not shown in FIG. 2) connected to a TIA (not shown in FIG. 2), and may be incorporated partly or completely in the optical bias control circuit 211. The second O/E converter 222 provides an electrical signal 223, which is proportional to the output power ($P_{out}$) from the MZM 234, to the optical bias control circuit 211. As such, the electrical signal 223 serves as a second input to the optical bias control circuit. Accordingly, in accordance with a representative embodiment, electrical signal 209, which is proportional to the input power ($P_{in}$) to the MZM 234 serves as a first input to the optical bias control circuit 211; and electrical signal 223, which is proportional to the output power ($P_{out}$) from the MZM 234 serves as a second input to the optical bias control circuit 211.

As described more fully below, in accordance with a representative embodiment, the ratio of the output power of the output optical signal 242 from the MZM 234 to the input power of the input optical signal 241 provided to the MZM 234 ($P_{out}/P_{in}$) is maintained at 0.5 after accounting for losses within the MZM 234, the first and second optical taps 206, 224, and optical fibers and interconnects. This causes the MZM 234 to operate at the quadrature point, as described more fully below in connection with FIGS. 3A-3B. So, during operation, the MZM 234 is biased by the optical bias control circuit to operate at its quadrature point. When the switch 232 is engaged, depending on its magnitude, a DC component of the electrical signal from the DUT input to the RF port of the MZM 234 may alter the bias of the MZM 234 and cause the MZM 234 to shift from its quadrature point. This in turn, will cause the ratio of $P_{out}/P_{in}$ of the MZM 234 to change from 0.5 (or 50% transmission after accounting for losses). As described more fully below in connection with FIG. 4, the optical bias control circuit 211 is adapted to change the bias signal 240 provided to the second input 236 to the MZM 234 to a lower or higher value to return $P_{out}/P_{in}$ of the MZM 234 to 0.5. As such, a shift in the bias of the MZM 234 caused by the DC component of the electrical signal from the DUT will cause the bias of the MZM 234 to change (increase or decrease) and result in a change in the ratio of $P_{out}/P_{in}$ from the desired 0.5. To return the ratio of $P_{out}/P_{in}$ of the MZM 234 to 0.5, the bias signal 240 and the second input 236 are changed by the optical bias control circuit 211. The change compensates the shift from the desired quadrature bias of the MZM 234 caused by the DC component of the first input 233. Thus, the second input 236 is proportional in magnitude, but possibly opposite in sign to the DC contained in the first input 233. This returns the ratio of $P_{out}/P_{in}$ of the MZM 234 to 0.5. As noted above, and as described more fully below, the first output signal 212 from the optical bias control circuit 211 is proportional to the bias applied to the MZM 234 that may have an opposite sign. As such, the first output signal 212 provided to the oscilloscope is representative of the DC component of the input signal from the DUT.

Stated somewhat differently, the bias control of the MZM 234 operates in a closed control loop. As such, the application of a DC electrical signal from the DUT to the RF port of the MZM 234 at the first input 233 may cause the MZM 234 to move from its quadrature point. This movement from the quadrature point causes a change in the value of the output optical signal 242 from the MZM 234, and a corresponding change in the ratio of $P_{out}/P_{in}$ from 0.5. To return the ratio of $P_{out}/P_{in}$ to 0.5, the second input 236, which is proportional in magnitude but opposite in sign to/from the DC electrical signal to the first input 233 from the DUT, must be applied to the bias input of the MZM 234 to offset the shift from the quadrate point. Because the bias signal 240 and the resulting bias signal to the second input 236 restore the proper quadrature bias, the optical bias control circuit 211 contains the information about the DC of the first input 233. Hence, the first output signal 212 from the optical bias control circuit 211 and the resulting electrical signal from DAC 218 that is provided to the oscilloscope 140 are proportional to the DC electrical signal from the DUT. Beneficially, therefore, the present teachings enable the DC voltage from a comparatively high voltage signal from the DUT to be measured by the oscilloscope 140.

Figure 3A:
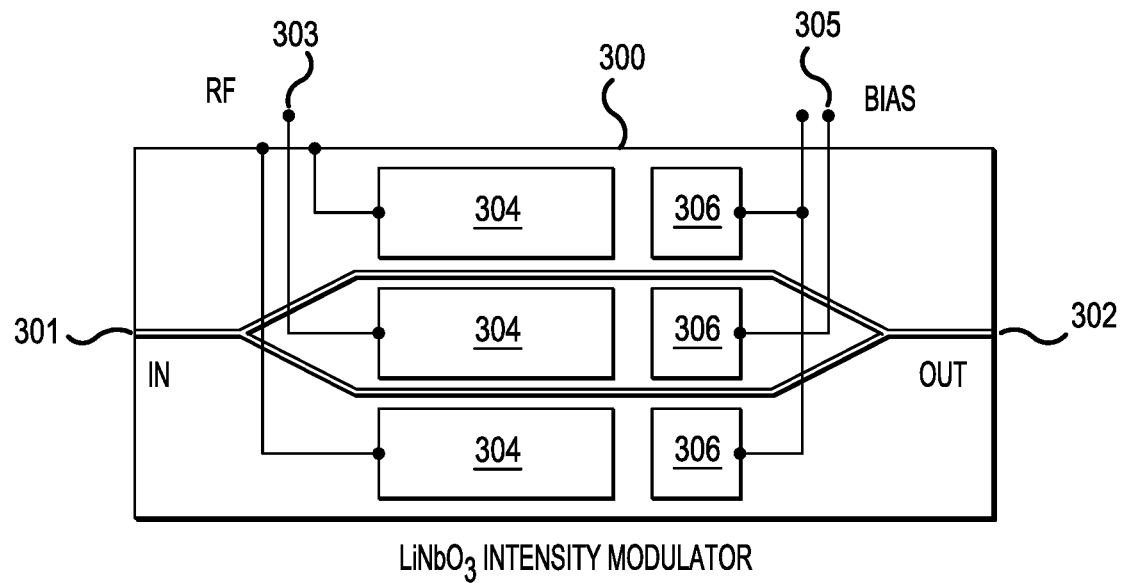
FIG. 3A is a top view of a Mach-Zehnder modulator (MZM) in accordance with a representative embodiment.

FIG. 3A is a top view of an MZM 300 in accordance with a representative embodiment. The MZM 300 may be implemented in the probe heads 110, 210, and functions as the E/O converter of the probe heads 110, 210 as noted above. Certain details and aspects of the MZM 300 are common to MZM 234, for example, described above, and may not be repeated to avoid obscuring the description of the present representative embodiments.

The MZM 300 is an electro-optic modulator, such as a known lithium niobate ($LiNbO_3$) modulator. The MZM 300 comprises an optical input 301 and an optical output 302. RF inputs 303 are connected to RF electrodes 304, which are coupled to the lithium niobate material of the MZM 300. Similarly, bias inputs 305 are connected to bias electrodes 306, which are coupled to the lithium niobate material of the MZM 300. As is known, lithium niobate is an electrooptic material. As such, application of RF signals (including DC signals in keeping with the present teachings) and bias signals results in an alteration of the index of refraction ($n_r$). As will be appreciated, application of voltages at the RF inputs 303 and the bias inputs 305 cause the MZM 300 to function as an intensity modulator.

However, in addition to being an electrooptic material, lithium niobate is also a piezoelectric and pyroelectric material. Therefore, mechanical forces, acoustic waves, and temperature changes induce a voltage in the lithium niobate material. Additionally, a dielectric material (e.g., $SiO_2$) is often provided between the RF electrodes 304 and the lithium niobate, and the bias electrodes 306 and the lithium niobate. This dielectric material acts like a dielectric of a parasitic capacitor, and can cause charge accumulation and a resulting electrostatic field. Regardless of their source, these voltages induced from factors external to the MZM 300 cause an undesired change in the index of refraction ($n_r$) of the lithium niobate, and ultimately an undesired source of modulation by the MZM 300. Ultimately, these various factors can cause an undesired drift in the bias point of the MZM 300. The two arms that comprise the Mach-Zehnder interferometer enhance the described effects.

Figure 3B:
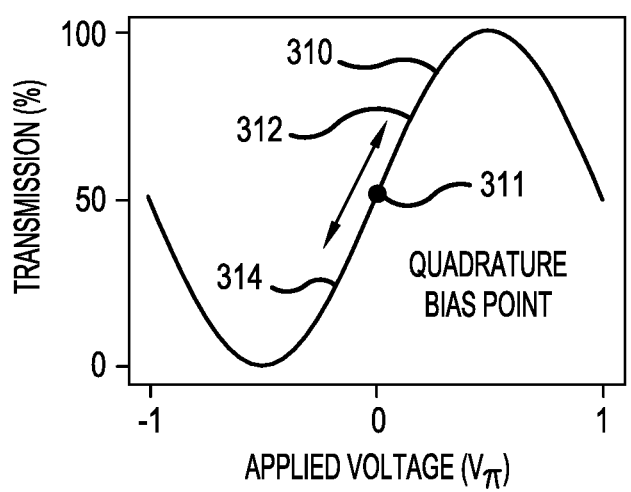
FIG. 3B is a transfer function of transmission versus applied voltage of an MZM in accordance with a representative embodiment.

FIG. 3B is a transfer function 310 (sometimes referred to as a transmission curve) of transmission versus applied voltage of an MZM in accordance with a representative embodiment. As would be appreciated by one of ordinary skill in the art, transfer functions are often used to describe the function of an interferometer.

As noted above, in accordance with a representative embodiment, the MZM 234 operates at its MZM quadrature bias point 311, where the applied voltage results in a transmission of 50%. As will be appreciated, when the MZM 234 operates at the MZM quadrature bias point 311, $P_{out}/P_{in}$ equals 0.5 after accounting for losses in the MZM, couplers, and other components. However, application of a DC signal from the DUT as the first input 233 at the RF input of the MZM 234 may result in a shift of the bias point of the MZM on transfer function 310. For example, based on the DC signal from the DUT the bias point may shift to point 312 on the transfer function 310 or to point 314 on the transfer function 310. The shift may be compensated applying a voltage to bias inputs 305 of bias electrodes 306. Since RF electrodes 304 and bias electrodes 306 typically have different applied voltages ($V_\pi$), the voltage applied to bias electrodes 306 that compensates the shift is not equal to, but is proportional to, the DC value contained in the first input 233 to MZM 234. However, after calibration, the change in the bias voltage is a measure of the DC signal from the DUT, excluding bias changes by external factors for the sake of clarity at this point.

When the bias point increases or decreases from the MZM quadrature bias point 311, the transmission of the MZM 234 correspondingly changes. This change in transmission is manifest in a change in $P_{out}/P_{in}$ that is greater than or less than, respectively, 0.5, after accounting for losses. So, and in keeping with the previously described representative embodiment, the second input 236 from the optical bias control circuit 211 is changed proportionally to the DC signal from the DUT provided at first input 233 of the MZM 234. As such, the first output signal 212 from the optical bias control circuit 211 is proportional to the bias input signal at the second input 236 to the MZM 234 with exception for an offset that is estimated using switch 232 as described below (and above).

As noted above, drift of the bias point in MZMs 234, 300 can also be induced by external factors, such as temperature and mechanical forces. As noted above, the switch 232 provided in the probe head 210 allows for a resetting of the first output signal 212 when testing of the DUT is not in progress. To this end, disengaging the switch 232 will prevent electrical signals from the DUT to be applied to the MZM 234. In this state, as always, $P_{out}/P_{in}$ is maintained at 0.5 and the first output signal 212 is set to "zero" as there is no DC at the RF port of the MZM 234. After the switch 232 is reengaged the DC component of the first input 233 can be precisely estimated even when the bias point has drifted from the MZM quadrature bias point 311 due to external factors. In all cases, the bias signal 240 and thus the second input 236 provided to the bias input of the MZM 234 maintains the power ratio $P_{out}/P_{in}$ at the desired value of 0.5 after accounting for losses, and the MZM 234 is operating at the MZM quadrature bias point 311.

Resetting of the first output signal 212 to zero is recommended before each calibrated measurement. Although not exhaustive, one way used to determine when a reset is needed is to characterize the drift of the MZM 234 over time and temperature. These results can be then used to estimate the time before resetting. Stated somewhat differently, by determining the time the MZM 234 takes to drift outside a specified range, the resetting can be set to occur at a time before that determined time duration occurs.

Figure 4A:
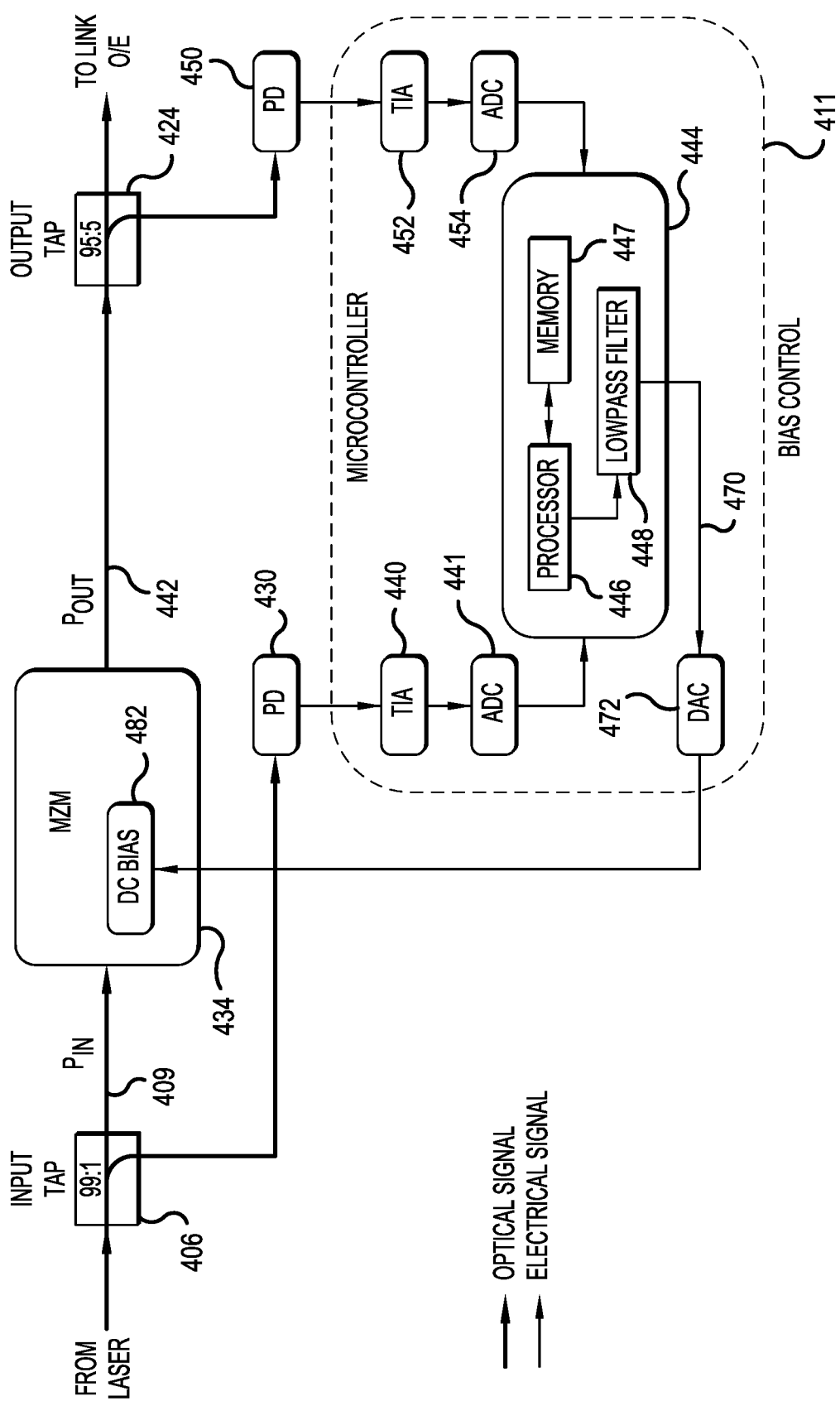
FIG. 4A is a simplified schematic block diagram of a bias control circuit connected to a Mach-Zehnder modulator (MZM) in accordance with a representative embodiment.

FIG. 4A is a simplified schematic block diagram of an optical bias control circuit 411 connected to a Mach-Zehnder modulator (MZM) 434 in accordance with a representative embodiment. Many details and aspects of the various components of the representative embodiments described in connection with FIGS. 1-3B are common to those of the optical bias control circuit 411 of the presently described representative embodiments, and may not be repeated to avoid obscuring the description of the presently described representative embodiments.

Referring to FIG. 4A, the output of the laser (not shown in FIG. 4) is provided to first optical tap 406. The first optical tap 406 provides a significant portion of the signal output power from the laser as the input power ($P_{in}$) to an MZM 434, which is disposed in a probe head (not shown in FIG. 4). A small portion (illustratively approximately 1% to approximately 5%) of $P_{in}$ is provided to a first photodetector 430, which provides its output to a first TIA 440. Again, if $P_{in}$ is substantially constant, the first optical tap 406 is optional, and a constant input that is representative of $P_{in}$ can be provided to the optical bias control circuit 411.

As alluded to above, the first photodetector 430 and the first TIA 440 can provide one of the O/E converters (e.g., first O/E converter 208 shown in FIG. 2) used in connection with the present teachings.

The output of the first TIA 440 undergoes a digital conversion at a first ADC 441, and is provided to a controller 444, which may include a processor 446 or microprocessor, and a memory 447. As noted, the controller 444 comprises the processor 446, which is tangible and non-transitory, and is representative of one or more processors. As used herein, the term "non-transitory" is to be interpreted not as an eternal characteristic of a state, but as a characteristic of a state that will last for a period. The processor 446 may also be (or include) a microprocessor, a microcomputer, a processor chip, a controller, a microcontroller, a digital signal processor (DSP), a state machine, or a programmable logic device. The processor 446 may also be (or include) a programmable logic device (PDL), including a programmable gate array (PGA) such as a field programmable gate array (FPGA), or another type of circuit that includes discrete gate and/or transistor logic. The processor 446 may be a central processing unit (CPU), a graphics processing unit (GPU), or both. Additionally, the processor 446 may comprise multiple processors, parallel processors, or both. Multiple processors may be included in, or coupled to, a single device or multiple devices. The term "non-transitory" specifically disavows fleeting characteristics such as characteristics of a carrier wave or signal or other forms that exist only transitorily in any place at any time. As described more fully below in connection with FIG. 4B, the processor 446 for the controller 444 is configured to execute software instructions stored in memory 447 to perform functions as described in the various embodiments herein. The processor 446 may be a general-purpose processor or may be part of an application specific integrated circuit (ASIC).

The memory 447 is a tangible non-transitory computer-readable medium that stores instructions, which when executed by the processor 446, cause the processor 446 to determine a particular bias level for MZM 434 to maintain its operation at the quadrature point as discussed above. As used herein, the term "non-transitory" is to be interpreted not as an eternal characteristic of a state, but as a characteristic of a state that will last for a period of time. The term "non-transitory" specifically disavows fleeting characteristics such as characteristics of a carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

The memory 447 may comprise a main memory or a static memory, or both, where the memories may communicate with each other via a bus (not shown). The memory 447 described herein are tangible storage media that can store data and executable instructions and are non-transitory during the time instructions are stored therein. Among other instructions, the memory stores instructions, which when executed by the processor, causes the processor to determine a bias input to MZM 434 from optical bias control circuit 411 to maintain the MZM 434 at a quadrature point so that ($P_{out}/P_{in}$) is maintained at 0.5.

A small portion (illustratively approximately 1% to approximately 5%) of $P_{out}$ is provided to a second photodetector 450, which provides its output to a second TIA 452. As alluded to above, the second photodetector 450 and the second TIA 452 can provide one of the O/E converters (e.g., first O/E converter 208 shown in FIG. 2) used in connection with the present teachings. The output of the second TIA 452 undergoes a digital conversion at a second ADC 454, and is provided to the controller 444.

The controller 444 determines and outputs a bias signal 470, which is provided as a DC bias input 482 of the MZM 434. As such, like bias signal 240 described in connection with representative embodiments of FIG. 2, the bias signal 470 from the optical bias control circuit 411 provides a second input signal to the MZM 434, and serves as the bias input to the MZM 434.

Beneficially, and as described more fully below with respect to FIG. 4B, the optical bias control circuit 411 is adapted to change the bias signal 470 to a lower or higher DC value to return $P_{out}/P_{in}$ of the MZM 434 to 0.5. As such, a drift in the bias of the MZM 434 caused by the DC component of the electrical signal from the DUT is compensated by the bias signal 470 applied to the DC bias input 482. To return the ratio of $P_{out}/P_{in}$ of the MZM 234 to 0.5, the bias signal 470 is changed by the optical bias control circuit 411 by a magnitude that is proportional to the DC voltage contained in the first input 233 of FIG. 2. As noted above with reference to FIG. 2, the first output signal 212 from the optical bias control circuit 211 is proportional the bias applied to the MZM 234. As such, the first output signal 212 provided to the oscilloscope 140 is representative of the DC component of the input signal from the DUT.

An output optical signal 442 is provided from the MZM 434. The output optical signal 442 is incident on a second optical tap 424. The second optical tap 424 provides a significant portion of the signal output power from the laser as the output power ($P_{out}$) from the MZM 434 to an O/E converter (not shown in FIG. 4). Illustratively, this output of the second optical tap 424 is third O/E converter 226 described in connection with the representative embodiments of FIG. 2. As noted above, the output optical signal 442 passes only AC signals having frequencies greater than the frequency response of the optical bias control circuit 411 to the O/E converter, and ultimately to the oscilloscope. Again, this is expected as the optical bias control circuit 411 cannot observe signals that are outside of its bandwidth. By contrast, the frequencies that are within the bandwidth of the optical bias control circuit 411 are sensed and corrections to the DC bias input 482 are applied through a DAC 472.

Figure 4B:
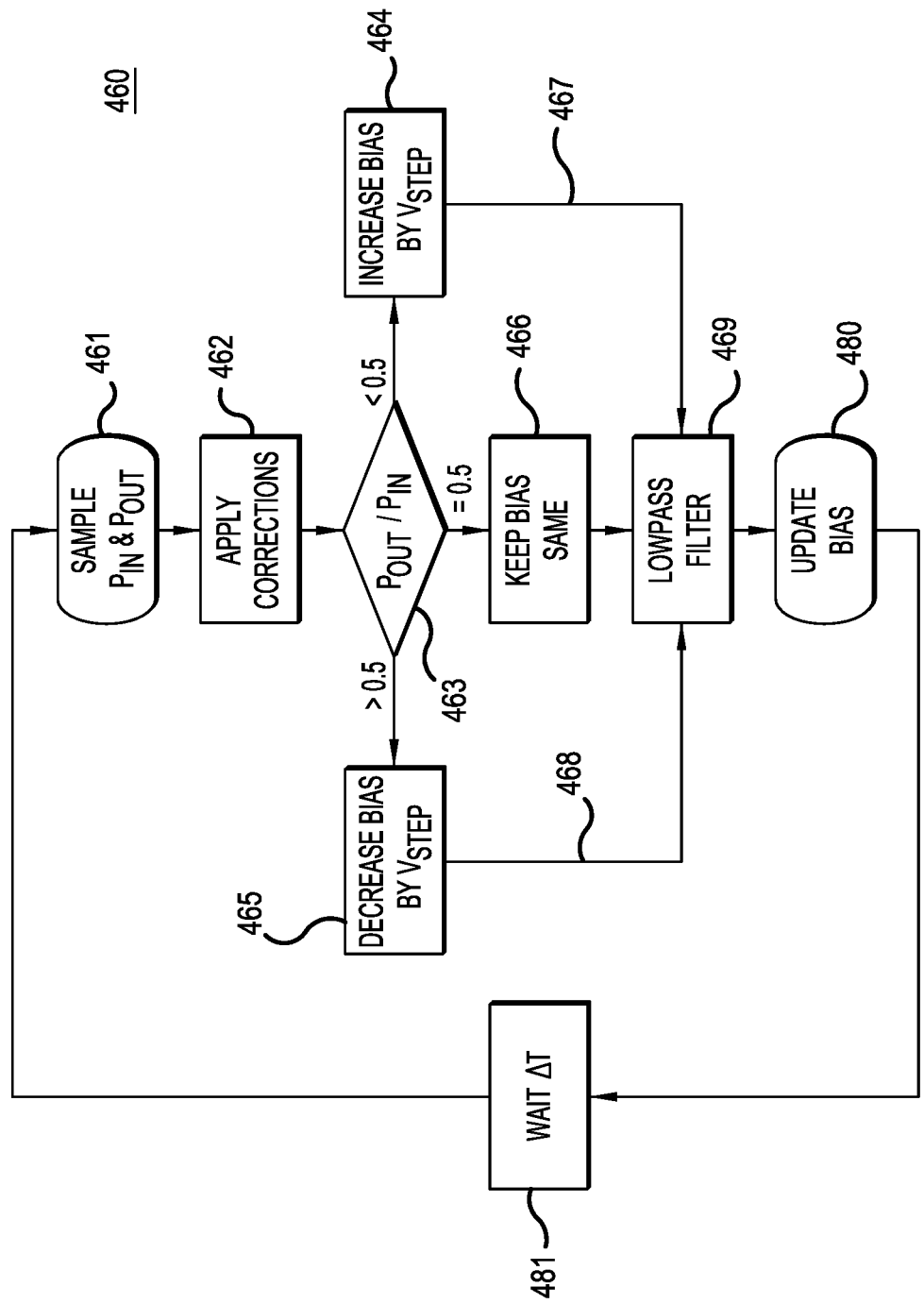
FIG. 4B is a flow chart of a process for setting a bias input to an MZM from a bias control circuit to maintain the MZM at a quadrature point, in accordance with a representative embodiment.

FIG. 4B is a flow chart of a process 460 for setting a bias input to an MZM from an optical bias control circuit to maintain the MZM at a quadrature point, in accordance with a representative embodiment. As noted above, the process 460 is provided as instructions stored in the memory. These instructions, when executed by the processor 446, causes the processor 446 iteratively to determine a bias input to MZM 434 from optical bias control circuit 411 to the DC bias input 482 to maintain the MZM 434 at a quadrature point so that ($P_{out}/P_{in}$, is maintained at 0.5.

Many details and aspects of the various components of the representative embodiments described in connection with FIGS. 1-4A are common to those of the process 460 of the presently described representative embodiments, and may not be repeated to avoid obscuring the description of the presently described representative embodiments. Moreover, while the process 460 is described primarily in connection with maintaining the MZM 434 at a desired quadrature point, the various aspects and details of process 460 are applicable to the probe head 210 and the control box 220 described in accordance with the representative embodiments of FIG. 2, and to the probe head and a control box in accordance with the representative embodiments of FIG. 5.

At 461, the input signals representative of $P_{out}$ and $P_{in}$ from first ADC 441 and ADC 462, respectively, at the controller 444, are measured.

At 462 corrections for additional losses are applied. Corrections may include accounting for ratios of the first and second optical taps 406,424, losses at MZM 434, O/E conversions factors in first and second photodetectors 430, 450, and gains in the first and second TIAs 440, 452.

At 463, the ratio of $P_{out}/P_{in}$ is determined. The specific choices of how to proceed once the $P_{out}/P_{in}$ ratio is known depends on the slope of the MZM quadrature bias point 311 and the specific gains of the signal paths from first and second photodetectors 430, 450 to controller 444. In the following illustrative example, it is assumed the slope is as shown for the MZM quadrature bias point 311 and signal path gains are non-inverting.

If the ratio is determined to be less than 0.5, at 464, the bias input signal from DAC 472 to DC bias input 482 of the MZM 434 is increased by an increment $V_{step}$, which is equal to an integer multiple of the minimum resolution of the DAC 472. Using the minimum resolution of the DAC 472 provides sufficiently accurate control of the bias voltage to DC bias input 482, although larger integer multiples may provide a faster response.

Next, the increased bias voltage is provided to a lowpass filter 469 to limit the maximum frequency response of the optical bias control circuits described above and below, and at 480, the output of the DAC 472 is updated to the new bias voltage applied to the DC bias input 482 of the MZM 434.

At 481, the bias voltage from the DAC 472 applied to DC bias input 482 of the MZM 434 in 480 is maintained for a time duration of ΔT, where 1/ΔT equals the sampling rate of the system, which is the time interval between each execution of 461. Due to the well-known Nyquist-Shannon sampling theorem, the sampling rate is at least twice the desired frequency response of the optical bias control circuit 411. The delay ΔT together with a cumulative delay of all the prior steps defines the bandwidth of the controller.

Upon delay ΔT at 481 the process 460 repeats beginning at 461.

Alternatively, if at 463 the ratio of $P_{out}/P_{in}$ is determined to be greater than 0.5, at 465, the bias input signal to DC bias input 482 of the MZM 434 is decreased by $V_{step}$, which is equal to an integer multiple of the minimum resolution of the DAC 472.

Next, the decreased bias voltage is provided to a lowpass filter 469 to limit the maximum frequency response of the optical bias control circuit as described above, and at 480, the bias voltage is updated to the new bias voltage is applied from the DAC 472 to the DC bias input 482 of the MZM 434.

At 481, the bias voltage applied to DC bias input 482 of the MZM 434 is maintained for a time duration of ΔT.

Upon delay ΔT in 481, the process 460 repeats beginning at 461.

Finally, if, at 463, the ratio of $P_{out}/P_{in}$ is determined to be 0.5 at or within a small fraction (related to the least significant bit of the DAC 472) of 0.5, at 466, the bias input signal from the DAC 472 to DC bias input 482 of the MZM 434 is maintained at its current level.

Figure 5:
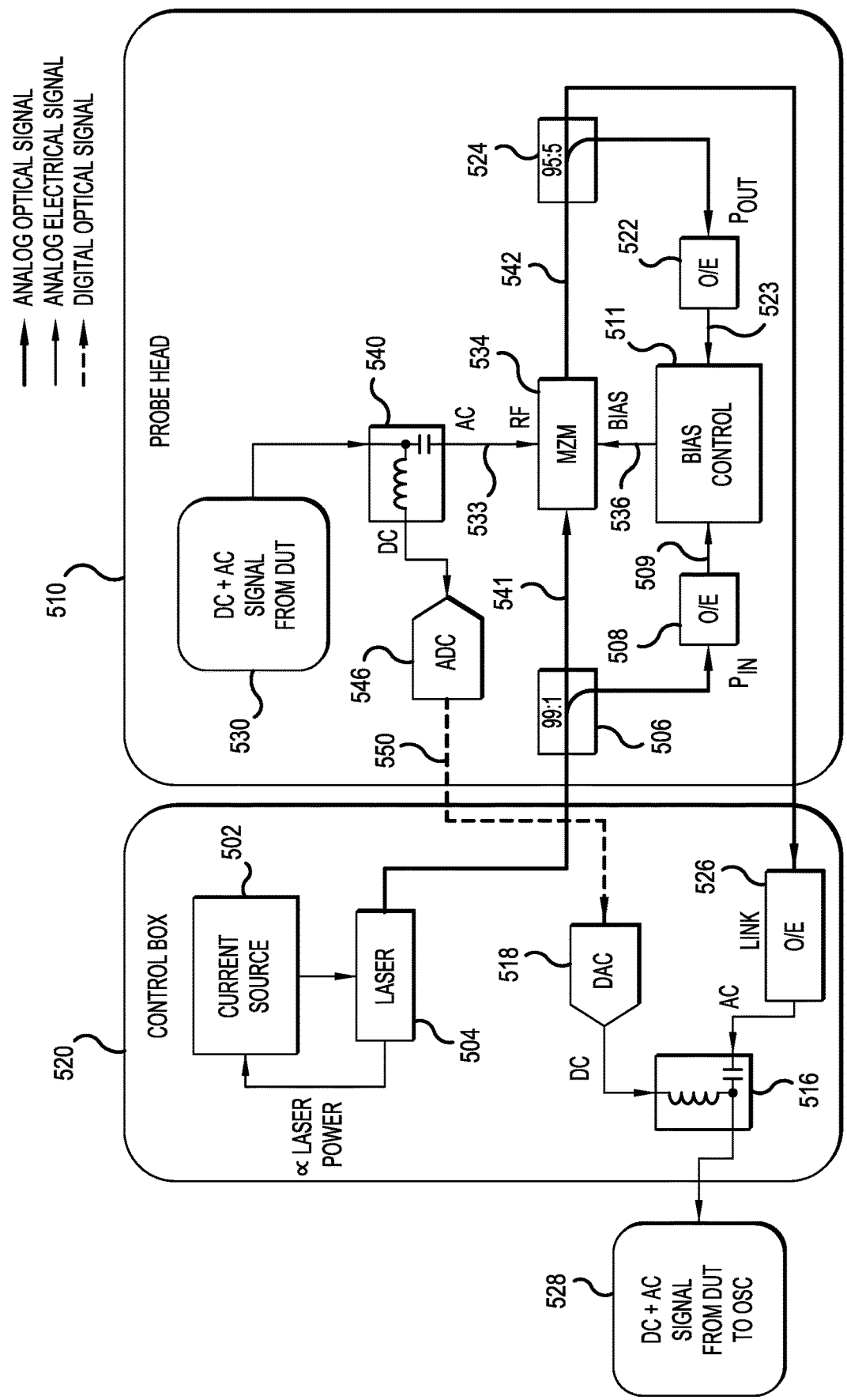
FIG. 5 is a simplified schematic block diagram of a probe head and a control box in accordance with another representative embodiment.

FIG. 5 is a simplified schematic block diagram of a probe head 519 and a control box 520 in accordance with another representative embodiment.

The probe head 510 and the control box 520 are adapted to function in system 100 to allow measurement of both high voltage AC and high voltage DC signals from a DUT (not shown in FIG. 5). As such, various details and aspects of the description of system 100, the probe head 210, the control box 220, the optical bias control circuit 411, and process 460 described above in connection with the representative embodiments of FIGS. 1-4B may be common to the description of the probe head 510 and the control box 520, but may not be repeated to avoid obscuring the descriptions of the representative embodiments of FIG. 5.

Referring to FIG. 5, the control box 520 comprises a current source 502, which provides an input to a laser 504. Notably, a portion of the output laser power is input to the current source via a feedback loop so that the power of the signal output from the laser 504 remains substantially constant for reasons that will become clear as the present description continues.

The output from the laser 504 is provided to a first optical tap 506 disposed in the probe head 510. The first optical tap 506 provides a significant portion of the signal output power from the laser to the MZM 534 as described below. A small portion (illustratively approximately 1% to approximately 5%) of the power output from the laser 504 is provided to a first O/E converter 508 disposed in the probe head 510. This small portion of the optical power from the first optical tap 506 is representative of the input power ($P_{in}$) to an MZM 534 in the probe head 510. As will be appreciated as the present description continues, the MZM 534 receives input electrical signals from the DUT, and outputs optical signals to the control box 520. As such, the MZM 534 functions as an E/O converter, and thus electrically isolates the oscilloscope from the comparatively high voltage AC and DC signals from the DUT.

The first O/E converter 508 illustratively comprises a photodetector (not shown in FIG. 5) connected to a transimpedance amplifier (TIA) (not shown in FIG. 5), and may be incorporated partly or completely in an optical bias control circuit 511 as discussed above. The first O/E converter 508 provides an electrical signal 509, which is proportional to $P_{in}$ from the laser 504, as a first input to optical bias control circuit 511. As described above, the electrical signal 509 from the laser 504 is provided as one input to the optical bias control circuit 511 that aids in biasing the MZM 534.

In operation, an input optical signal 541 is provided to the MZM 534, and an output optical signal 542 is provided from the MZM 534. The output optical signal 542 is input to the second optical tap 524. The output optical signal 542 contains AC signals having frequencies greater than the frequency response of the optical bias control circuit 511 to a third O/E converter 526 of the control box 520. A small portion (illustratively approximately 1% to approximately 5%) of the output optical signal power is provided to a second O/E converter 522. Like the first O/E converter 508, the second O/E converter 522 illustratively comprises a photodetector (not shown in FIG. 5) connected to a TIA (not shown in FIG. 5), and may be incorporated partly or completely in the optical bias control circuit 511. The second O/E converter 522 provides an electrical signal 523, which is proportional to the output power ($P_{out}$) from the MZM 534. The electrical signal 523 serves as a second input to the optical bias control circuit 511. Accordingly, in accordance with a representative embodiment, electrical signal 509, which is proportional to the input power ($P_{in}$) to the MZM 534 serves as a first input to the optical bias control circuit 511; and electrical signal 523, which is proportional to the output power ($P_{out}$) from the MZM 534 serves as a second input to the optical bias control circuit 511. As described more fully below, in accordance with a representative embodiment, the ratio of the output power of the output optical signal 542 from the MZM 534 to the input power of the input optical signal 541 provided to the MZM 534 ($P_{out}/P_{in}$) is maintained at 0.5 after accounting for losses within the MZM 534, the first and second optical taps 506, 524, and optical fibers and interconnects. This causes the MZM 234 to operate at the quadrature point, as described above in connection with FIGS. 3A-3B.

By contrast, as described more fully above, the optical bias control circuit 511 is not responsive to time varying (AC) signals having frequencies greater than its frequency response. Again, the optical bias control circuit 511 cannot respond to frequencies that are beyond its bandwidth. The optical bias control circuit 511 responds to the frequencies that are within its bandwidth. Hence, the bias controller contains information about the MZM 534 bias drift and corrects for it by applying the bias signal to the second input 536 to the MZM 534. Since the crossover filter 540 separates the frequencies from the DUT into a lower band (DC) and an upper band (AC), with the crossover frequency being somewhere between 1 Hz and 10 kHz, only the frequencies from the upper band are applied to the MZM 534. Only these upper band frequencies are modulated onto the output optical signal 542 at the MZM 534 output and are consequently routed to the control box 520 and the summing circuit 516.

In accordance with the presently described representative embodiment, the probe head 510 receives an input signal from the DUT via a connection 530, which may comprise the sensor tip 112 and probes 114 shown in FIG. 1. The input signal comprises an AC component, and a DC component, which as noted above includes both voltage signals with no time-varying component, or voltage signals with a time-varying component having frequencies that are lower than the crossover frequency of the crossover filter 540, as described more fully below.

As stated above, the input signal from the DUT is split into a low frequency band and a high frequency band by a crossover filter 540. The low frequency band comprises DC signals according to the present teachings, where the crossover filter has a crossover frequency between 1 Hz and 10 kHz. The remainder of the input signal from the DUT comprises signals in the high frequency band, and is transmitted through a first input 533, which is the RF input to the MZM 534.

By contrast, the low frequency band comprising DC signals as defined above, is provided by the crossover filter 540 to an ADC 546 as an analog signal as shown. The DC signals contained in the low frequency band are then provided as digital optical signals to DAC 518 of the control box 520 and to the summing circuit 516. Thus, the ADC 546 and the DAC 518, are a part of the low frequency optical link, possibly, a part of a digital optical link. The output from the summing circuit 516 is provided to the oscilloscope (not shown in FIG. 5) via a suitable electrical connector 528.

Since the weighted sum of the low frequency band and the high frequency band determined at the summing circuit 516 must yield the scaled version of the original signal from the DUT, the transfer functions that describe the crossover filter must add up to one. Stated somewhat differently, to ensure proper signal reconstruction there must be no loss of information or loss of any frequencies contained in the original signal from the DUT.

As described above, the low frequency band is transmitted through the low frequency optical link that contains ADC 546 and the DAC 518. The implementation of this link does not suffer from DC drift as it does not contain the MZM 534.

While DC is never present at the input of the MZM 534 due to the crossover filter 540, the drift of the bias point may still take place due to environmental effects, for example, due to fluctuations of temperature. However, the optical bias control circuit 511 always keeps the MZM in quadrature. Thus, ensuring the proper transmission of the high frequency band.

Since the low frequency band and the high frequency band are transmitted through two separate optical links, possibly having different gains or losses, the summing circuit 516 may require appropriate weighting of each signal so that they sum together with an final transfer function equal to one, as previously stated above. This may include subtraction or addition of DC. Determining the mentioned weighting is a part of instrument calibration.

Other variations to the disclosed embodiments can be understood and effected by those skilled in the art in practicing the claimed invention, from a study of the drawings, the disclosure, and the appended claims. In the claims, the word "comprising" does not exclude other elements. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An apparatus for providing a test signal from a device under test (DUT) to a measurement instrument, the apparatus comprising:
   a probe head configured to receive an electrical signal from the DUT, the probe head comprising an electro-optic modulator; and
   a control box comprising: an optical source, the optical source configured to provide an input optical signal having an input power level ($P_{IN}$) to the electro-optic modulator, which is configured to provide an output optical signal based on the electrical signal from the DUT, wherein the output optical signal has an output power level ($P_{OUT}$); and
   an optical bias control circuit, wherein a ratio of the input power level to the output power level ($P_{IN}/P_{OUT}$) is maintained at a substantially constant value.

2. The apparatus of claim 1, wherein the optical bias control circuit receives a portion of an output optical signal from the electro-optic modulator and maintains a bias of the electro-optic modulator substantially at a quadrature point.

3. The apparatus of claim 2, wherein the output optical signal from the electro-optic modulator provided to the optical bias control circuit is first converted to the electrical signal.

4. The apparatus of claim 1, wherein the electro-optic modulator comprises a Mach-Zehnder modulator (MZM).

5. The apparatus of claim 1, wherein the ratio of the input power level to the output power level ($P_{IN}/P_{OUT}$) is substantially equal to 0.5.

6. The apparatus of claim 1, wherein the output optical signal has an output power level and the output power level is maintained at a substantially constant value.

7. The apparatus of claim 1, wherein the electrical signal has an alternating current (AC) component, and a direct current (DC) component.

8. The apparatus of claim 7, wherein a frequency response of the optical bias control circuit is substantially DC.

9. The apparatus of claim 8, wherein the DC component of the bias is combined with the AC component received from the electro-optic modulator to reconstruct an original electrical signal.

10. An apparatus for providing a test signal from a device under test (DUT) to a measurement instrument, the apparatus comprising:
   a probe head configured to receive an electrical signal from the DUT, the probe head comprising an electro-optic modulator; and
   a control box comprising: an optical source, the optical source configured to provide an input optical signal to the electro-optic modulator, which is configured to provide an output optical signal based on the electrical signal from the DUT, the electrical signal having a direct current (DC) component, and an alternating current (AC) component; and an optical bias control circuit configured to provide a bias control signal to the electro-optic modulator, wherein the bias control signal to the electro-optic modulator is proportional to a magnitude of the DC component.

11. The apparatus of claim 10, wherein the bias control signal to the electro-optic modulator comprises the DC component of the electrical signal and the signal received from the electro-optic modulator comprises the AC component of the electrical signal.

12. The apparatus of claim 10, wherein the optical bias control circuit receives a portion of an output optical signal from the electro-optic modulator and maintains the bias of the electro-optic modulator substantially at a quadrature point.

13. The apparatus of claim 12, wherein the output optical signal from the electro-optic modulator provided to the optical bias control circuit is first converted to the electrical signal.

14. The apparatus of claim 10, wherein the electro-optic modulator comprises a Mach-Zehnder modulator (MZM).

15. The apparatus of claim 10, wherein the input optical signal has an input power level, and the output optical signal has an output power level, wherein a ratio of the input power level to the output power level is maintained at a substantially constant value.

16. An apparatus for providing a test signal from a device under test (DUT) to a measurement instrument, the apparatus comprising:
   a probe head configured to receive an electrical signal from the DUT, the probe head comprising: an electro-optic modulator; a crossover filter having low frequency output and a high frequency output, the high frequency output being provided to the electro-optic modulator; and
   a control box comprising an optical source, the optical source configured to provide an input optical signal to the electro-optic modulator, which is configured to provide an output optical signal based on the electrical signal from the DUT, wherein the control box is configured to receive a direct current (DC) component from the crossover filter and an alternating current (AC) component from the electro-optic modulator.

17. The apparatus of claim 16, wherein the control box further comprises an optical bias control circuit.

18. The apparatus of claim 17, wherein the optical bias control circuit receives a portion of an output optical signal from the electro-optic modulator and maintains the bias of the electro-optic modulator substantially at a quadrature point.

19. The apparatus of claim 16, wherein the electro-optic modulator comprises a Mach-Zehnder modulator (MZM).

20. The apparatus of claim 16, wherein the input optical signal has an input power level, and the output optical signal has an output power level, wherein a ratio of the input power level to the output power level is maintained at a substantially constant value.

21. The apparatus of claim 16, wherein the electrical signal has an AC component, and a DC component, and the probe head further comprises a circuit adapted to prevent the DC component from being input to the electro-optic modulator, and to provide the DC component to the control box.

22. The apparatus of claim 16, wherein the DC component received from the low frequency output of the crossover filter is combined with the AC component received from the electro-optic modulator to reconstruct the electrical signal from the DUT.

* * * * *